US012573999B2

(12) United States Patent
Sano et al.

(10) Patent No.: US 12,573,999 B2
(45) Date of Patent: Mar. 10, 2026

(54) ADJUSTMENT METHOD FOR ANTENNA DEVICE AND ANTENNA DEVICE

(71) Applicant: CASIO COMPUTER CO., LTD., Tokyo (JP)

(72) Inventors: Takashi Sano, Tokyo (JP); Takeshi Matsue, Tokyo (JP); Munetaka Seo, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 217 days.

(21) Appl. No.: 18/441,184

(22) Filed: Feb. 14, 2024

(65) Prior Publication Data

US 2024/0291152 A1    Aug. 29, 2024

(30) Foreign Application Priority Data

Feb. 27, 2023    (JP) .................................. 2023-028524

(51) Int. Cl.
 *H03H 7/38*    (2006.01)
 *H01Q 5/50*    (2015.01)
 *H04B 1/18*    (2006.01)
(52) U.S. Cl.
 CPC ................. *H03H 7/38* (2013.01); *H01Q 5/50* (2015.01); *H04B 1/18* (2013.01); *H03H 2007/386* (2013.01)
(58) Field of Classification Search
 CPC ...... H03H 7/38; H03H 2007/386; H03H 7/01; H03H 7/0115; H03H 7/0138; H03H 7/1775; H03H 7/1741; H03H 7/1758; H03H 7/1791; H03H 7/1766; H03H 11/28; H04B 1/18; H01Q 5/50

USPC .................................................. 333/175, 167
See application file for complete search history.

(56) References Cited

U.S. PATENT DOCUMENTS

| 5,493,311 A * | 2/1996 | Itoh ........................... | H03H 7/38 |
| | | | 343/900 |
| 2012/0056795 A1* | 3/2012 | Nagumo .................. | H01Q 9/40 |
| | | | 333/32 |

FOREIGN PATENT DOCUMENTS

| JP | 05-206888 A | 8/1993 |
| JP | 06-252791 A | 9/1994 |
| JP | 2020-014232 A | 1/2020 |

* cited by examiner

*Primary Examiner* — Stephen E. Jones
(74) *Attorney, Agent, or Firm* — Fitch, Even, Tabin & Flannery LLP

(57)    ABSTRACT

An adjustment method for an antenna device including an antenna, an adjustment circuit including first and second circuits connected in series with the antenna and a communication circuit connected with the adjustment circuit includes: determining constants of the first circuit such that at two frequencies, values of first resistance of first impedance as viewed from an output end of the first circuit toward the antenna each are equal to resistance of target impedance, and absolute values of first reactance of the first impedance are different from one another; and determining constants of the second circuit such that at the frequencies, while values of second resistance of second impedance as viewed from an output end of the adjustment circuit toward the antenna are kept at the values of the first resistance, values of second reactance of the second impedance each are a complex conjugate with reactance of the target impedance.

12 Claims, 4 Drawing Sheets

ADJUSTMENT METHOD FOR ANTENNA DEVICE AND ANTENNA DEVICE

REFERENCE TO RELATED APPLICATIONS

This application is based upon and claims the benefit of priority from the prior Japanese Patent Application No. 2023-028524, filed on Feb. 27, 2023, the entire content of which is incorporated herein by reference.

TECHNICAL FIELD

The present disclosure relates to an adjustment method for an antenna device and an antenna device.

DESCRIPTION OF RELATED ART

Many portable electronic devices that transmit and/or receive radio waves have an antenna built in a case. Small electronic devices, such as electronic wristwatches, have a limited space to accommodate an antenna device that includes an antenna and a transmitter/receiver circuit. In order to transmit and/or receive radio waves of multiple frequencies, such small electronic devices use an antenna device with values of reactance at the frequencies matched to the same/similar value and impedance matching performed near an intermediate frequency of the frequencies, thereby having a smaller space or a smaller number of components while handling transmission and/or reception of radio waves in a wide band. (See, for example, JPH 06-252791 A.)

SUMMARY OF THE INVENTION

According to an aspect of the present disclosure, there is provided an adjustment method for an antenna device including an annular antenna, an adjustment circuit including a first circuit and a second circuit connected in series with the antenna, and a wireless communication circuit connected with the adjustment circuit, including:

determining circuit constants of the first circuit such that at two frequencies as tuning targets, values of first resistance of first impedance as viewed from an output end of the first circuit toward the antenna each are equal to resistance of target impedance, and absolute values of first reactance of the first impedance are different from one another; and determining circuit constants of the second circuit such that at the two frequencies, while values of second resistance of second impedance as viewed from an output end of the adjustment circuit toward the antenna are kept at the values of the first resistance, values of second reactance of the second impedance each are a complex conjugate with reactance of the target impedance.

BRIEF DESCRIPTION OF DRAWINGS

The accompanying drawings are not intended as a definition of the limits of the present disclosure but illustrate embodiments of the present disclosure, and together with the general description given above and the detailed description of embodiments given below, serve to explain the principles of the present disclosure, wherein.

DETAILED DESCRIPTION

Hereinafter, one or more embodiments will be described with reference to the drawings.

Figure 1:
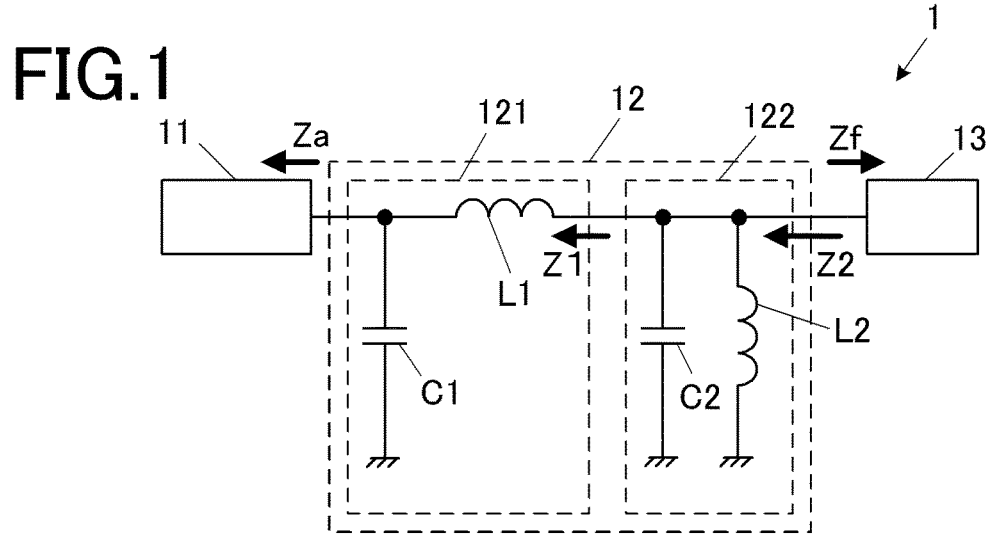
FIG. 1 shows the configuration of an antenna device of an embodiment.

FIG. 1 shows the configuration of an antenna device 1 of an embodiment.

The antenna device 1 includes an antenna element 11 (antenna), an adjustment circuit 12 and a communication circuit 13 (wireless communication circuit).

The antenna element 11 catches receiving-target radio waves and/or emits transmitting-target radio waves. In this embodiment, the antenna element 11 is disposed annularly along the periphery of a display surface that is circular in plan view. The antenna element 11 may not be fully circular. For example, the antenna element 11 may have an arc shape, such as a C-shape, which is a circular shape having a cut. In this embodiment, such an arc shape is included in being "annular". The antenna element 11 is not limited to but may be a unipole antenna.

The antenna device 1 is capable of transmitting and/or receiving radio waves of two frequencies. For example, the antenna device 1 receives a radio wave of a frequency f1 (1.57542 GHZ) in L1 band (receiving target or tuning target) and a radio wave of a frequency f2 (1.17645 GHz) in L5 band (receiving target or tuning target) from GPS (Global Positioning System) satellites for satellite positioning. The antenna element 11 has a part specific to reception having a length of about $\frac{1}{4}$ of the wavelength of a radio wave of an appropriate frequency between the frequencies (receiving frequencies) of radio waves to receive, the frequencies being different from one another.

The adjustment circuit 12 is a circuit for tuning frequencies of radio waves received by the antenna element 11 to the aforementioned two frequencies. The adjustment circuit 12 includes a first adjustment circuit 121 (first circuit) and a second adjustment circuit 122 (second circuit).

The communication circuit 13 is a circuit that demodulates and decodes received radio waves to obtain signals in the radio waves. The communication circuit 13 operates as a load connected to the antenna element 11 and the adjustment circuit 12.

Resistance Ra of impedance Za of the antenna element 11 and resistance RL of impedance ZL of the communication circuit 13 may not be the same. The antenna element 11 may have some reactance Xa due to, for example, parasitic capacitance of a connection wiring between the antenna element 11 and the adjustment circuit 12. Impedance of the communication circuit 13 with the parasitic capacitance and noise taken into account is expressed by $Zf=Rf+Xf$.

The adjustment circuit 12 matches impedance Z2 (second impedance) toward the antenna element 11 (upstream side) as viewed from its connection point with the communication circuit 13 with impedance (target impedance Zf) of the communication circuit 13 (downstream side). The matched impedance is a complex conjugate of the target impedance Zf, namely, near "Rf-Xf". At the time, with the reactance Xf being kept sufficiently small, the adjustment circuit 12 operates such that resistance R2 of the impedance Z2 becomes substantially equal to the resistance Rf, for example, VSWR (voltage standing wave ratio) falls in the range of 2.0 or less.

The first adjustment circuit 121 and the second adjustment circuit 122 are connected in series between the antenna element 11 and the communication circuit 13.

In the antenna device 1 of this embodiment, the first adjustment circuit 121 is an L-shaped circuit that includes, as adjustment elements, a first inductor L1 (first circuit element or one) connected in series in a signal path connecting the antenna element 11 and the communication circuit 13 and a first capacitor C1 (second circuit element or the other) disposed between the signal path and a ground plane, namely, connected in parallel with the communication circuit 13. In the antenna device 1 of this embodiment, the second adjustment circuit 122 includes, as adjustment elements, a second inductor L2 and a second capacitor C2 disposed between the signal path and the ground plane in parallel with the communication circuit 13. Hereinafter, an element disposed in series with the signal path may be referred to as a series element, and an element disposed between the signal path and the ground plane in parallel with the communication unit 13 may be referred to as a parallel element.

Next, an adjustment method for impedance matching in the antenna device 1 will be described.

FIG. 2A, FIG. 2B, FIG. 3A and FIG. 3B show examples of immittance chart for adjustment of the adjustment circuit 12. Each circular dashed line including the right end in FIG. 2A indicates equal resistance (R), and each dashed line extending radially from the right end in FIG. 2A indicates equal reactance (X). Each circular dotted line including the left end in FIG. 2A indicates equal conductance (G=1/R), and each dotted line extending radially from the left end in FIG. 2A indicates equal susceptance (B=1/X). On the circular dashed line passing through the center position O in FIG. 2A, the resistance R of the impedance Z to be matched is equal to the resistance Rf of the target impedance Zf. On the dotted line passing through the center position O in FIG. 2A, the conductance G of the admittance Y to be matched is equal to conductance Gf of target admittance Yf. The smaller the radius of the circular line, the greater the resistance R or the conductance G. The larger the bend (i.e., the smaller the radius of curvature) of the radial line, the smaller the reactance X or the susceptance B. In the upper half from the horizontal line passing through the center position O, the reactance X s positive, and the susceptance B is negative. In the lower half from the horizontal line, the reactance X is negative, and the susceptance B is positive. The thick solid line on the immittance chart shows the impedance Z in a range that includes the frequencies f1, f2. The range indicated by points f1H, f1C, f1L is the range of the frequency f1, and a point f2C indicates the frequency f2. A point fcC indicates an intermediate frequency fc between the frequencies of the points f1C, f2C.

Figure 2A:
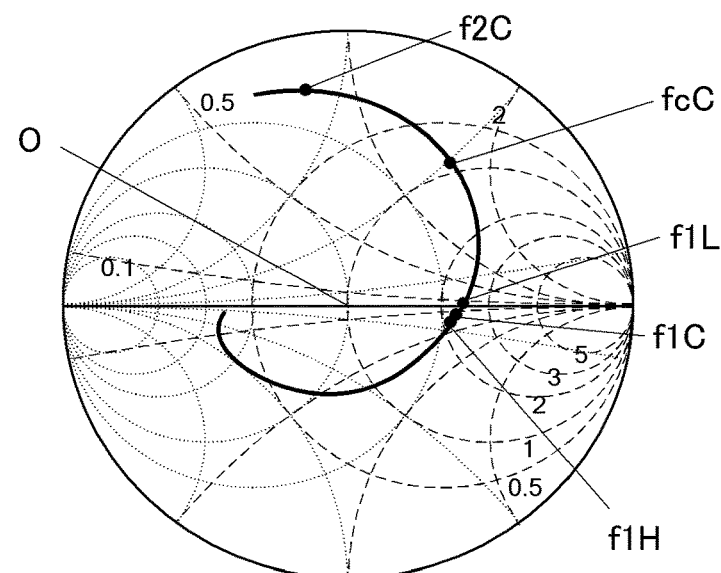
FIG. 2A shows an example of immittance chart for adjustment of an adjustment circuit.

FIG. 2A shows the impedance Za as viewed from the output end of the antenna element 11 toward the antenna element 11. In FIG. 2A, the reactance X at the frequency f1 is about 0, but not limited thereto, and the resistance R thereat is greater than the resistance of the target impedance Zf. The impedance (resistance R and reactance X) at the frequency f2 is greatly off. The resistance R at the intermediate frequency fc almost matches the resistance of the target impedance Zf, but not limited thereto.

From this state, impedance matching is performed by the adjustment method of this embodiment, namely, by adjusting parameters of the elements of the adjustment circuit 12. In the adjustment circuit 12, a series inductor works to increase the reactance X, and a series capacitor works to reduce (i.e., increase the negative value of) the reactance X. Further, in the adjustment circuit 12, a parallel inductor works to increase the susceptance B, and a parallel capacitor works to reduce the susceptance B.

Figure 2B:
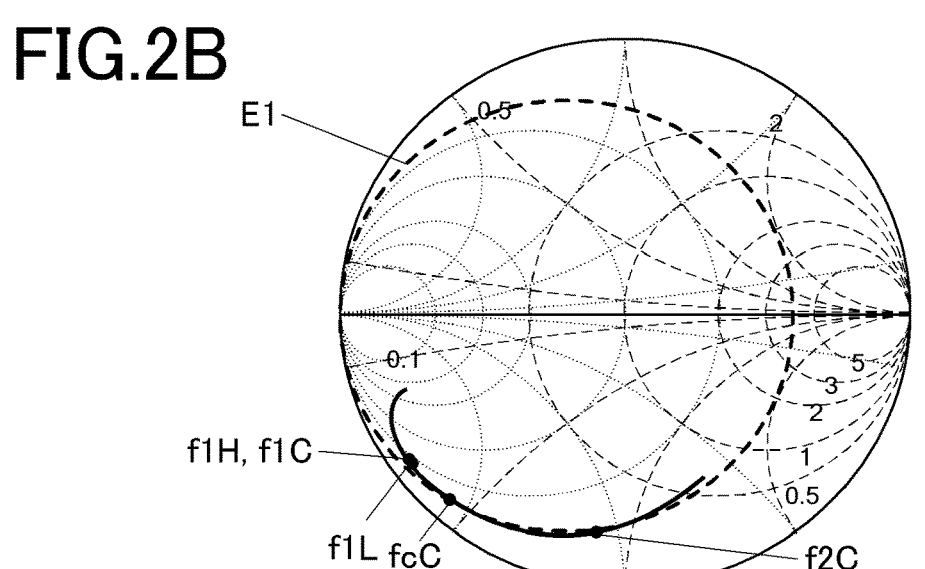
FIG. 2B shows an example of the immittance chart for adjustment of the adjustment circuit.
Figure 3A:
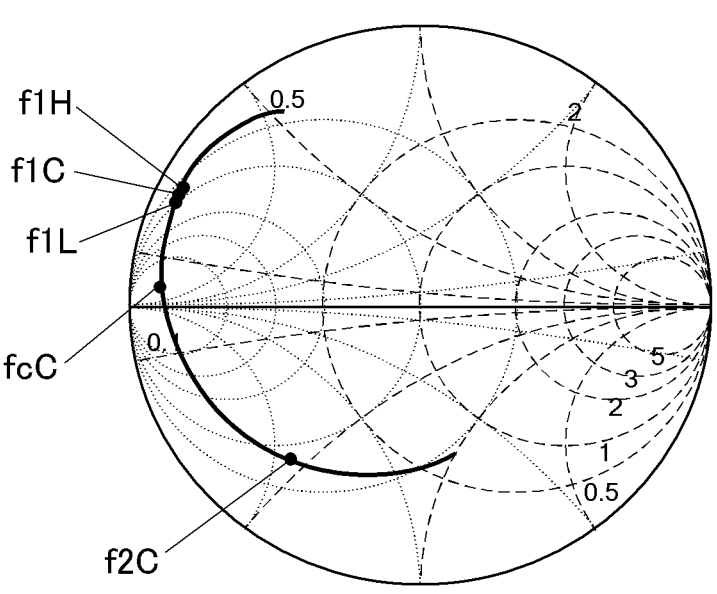
FIG. 3A shows an example of the immittance chart for adjustment of the adjustment circuit.

FIG. 2B and FIG. 3A each show impedance Z1 (first impedance) as viewed from a point (output end of the first adjustment circuit 121) between the first adjustment circuit 121 and the second adjustment circuit 122 toward the antenna element 11. As the susceptance B changes, the resistance R changes. Hence, as shown in FIG. 2B, due to the first capacitor C1, the points f1C, f2C move from their respective positions in FIG. 2A along a line E1 of equal conductance, and accordingly values of resistance R1 at the points f1C, f2C change.

Meanwhile, due to the first inductor L1, the points f1C, f2C each move along a line of equal resistance. Hence, values of conductance G1 at the points f1, f2C and their difference change, but the values of the resistance R1 at the points f1C, f2C do not change. By combining appropriate values of the inductance of the first inductor L1 and the electrical capacitance of the first capacitor C1 (parameters or circuit constants), as shown in FIG. 3A, the values of the resistance R1 of the impedance Z1 at the points f1C, f2C each can be made to be (converted into) a value equal to the resistance Rf of the target impedance Zf. In this case, as far as the values of the resistance R1 are matched, values of reactance X1 (first reactance) at the points f1C, f2C do not need to be conjugate. That is, the values of the reactance X at the points f1C, f2C may be the same absolute values of different signs (plus/positive and minus/negative), or may be different absolute values. In this embodiment, a difference between absolute values is not a product error or the like but a clear difference, such as a reflection coefficient Γ of 0.33 or more, the reflection coefficient Γ being expressed as the distance between the points f1C, f2C on the immittance chart. For the adjustment, either the impedance Z or the admittance Y at the point fcC is not taken into account.

Figure 3B:
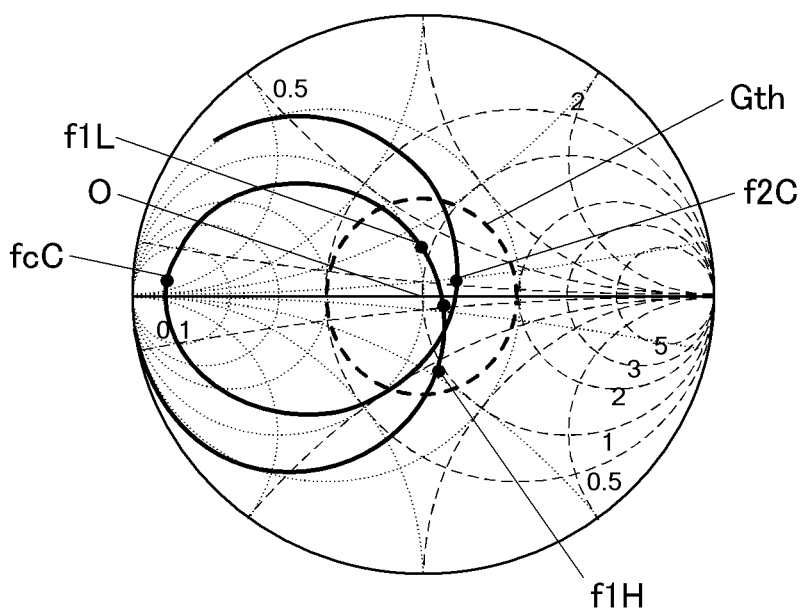
FIG. 3B shows an example of the immittance chart for adjustment of the adjustment circuit.

The parallel circuit composed of the second capacitor C2 and the second inductor L2 is also provided. FIG. 3B shows the impedance Z2 as viewed from the output end of the second adjustment circuit 122 (i.e., output end of the adjustment circuit 12) toward the antenna element 11 (upstream side). In accordance with both parameters (circuit constants) of the electrical capacitance of the second capacitor C2 and the inductance of the second inductor L2, the resonant frequency of the parallel circuit (parallel resonant circuit) is determined. Combination of these parameters adjusts the impedance Z2. By determining an appropriate combination of the parameters, to the impedance Z2, above and under the resonance frequency for the circuit (s) on the upstream side of the first adjustment circuit 121, points at each of which the susceptance B becomes 0 with the resistance R2 (second resistance) kept at the value (first resistance) adjusted in the first adjustment circuit 121 can be added. The adjustment is made such that this frequency, at which the susceptance B becomes zero, namely, reactance X2 (second reactance) of the impedance Z2 becomes zero (complex conjugate of the target impedance), is around each of the frequencies f1, f2. By appropriately matching values of the resistance R2 and values of the reactance X2 at the two frequencies, impedance matching is performed about both the frequencies.

The thick dashed line Gth in FIG. 3B indicates VSWR=2. The whole of the points f1L to f1H for the frequency f1 and the point f2C for the frequency f2 are in the area (range) where VSWR is 2 or less. Meanwhile, the point fcC, which indicates the intermediate frequency fc between the frequencies f1, f2, is clearly outside the area, which means that VSWR is clearly more than 2. That is, impedance matching is not performed about the intermediate frequency fc, which is not a tuning target. Even if a parallel resonant circuit having the intermediate frequency fc as the resonant frequency is inserted in place of the second adjustment circuit 122 in the state shown in FIG. 3A, the point fcC is still in the area where VSWR is more than 2.

The first adjustment circuit 121 is used, in the case where radio waves of two frequencies are received, to match the values of the resistance of the impedance of the first adjustment circuit 121 and the upstream side thereof at the respective frequencies with the resistance Rf of the target impedance Zf. In particular, the first adjustment circuit 121 is composed of the combination of the series element and the parallel element so as to be able to appropriately match the values of the resistance R1 with the resistance Rf of the target impedance Zf at the two frequencies as the receiving targets. Hence, a relationship between the resonant frequency of the antenna element 11 as viewed from the upstream side of the adjustment circuit 12 and the two frequencies f1, f2 is not limited much, which can give flexibility to the configuration of the device. Further, since the values of the resistance R1 at the two frequencies f1, f2 are directly matched to the target resistance Rf, the adjustment work is easy.

The second adjustment circuit 122 is used to match the values of the reactance X2 at the two frequencies f1, f2. For example, if the parameter (e.g., inductance) of one (e.g., second inductor L2) of the two elements is determined, the parameter (e.g., capacitance) of the other (e.g., second capacitor C2) thereof for resonating at the frequencies f1, f2 of radio waves desired to receive is determined.

FIG. 4A, FIG. 4B, FIG. 4C, FIG. 5A and FIG. 5B show other examples of the adjustment circuit 12.

As described above, the first adjustment circuit 121 is composed of the combination of the element that makes adjustment to change a correspondence between the values of the reactance X1 at the two frequencies f1, f2 by changing the reactance X1 without changing the resistance R1 and the element that adjusts the resistance R1 by changing the susceptance B. Hence, the change of the reactance X1 and the susceptance B may be either capacitive or inductive.

Figure 4A:
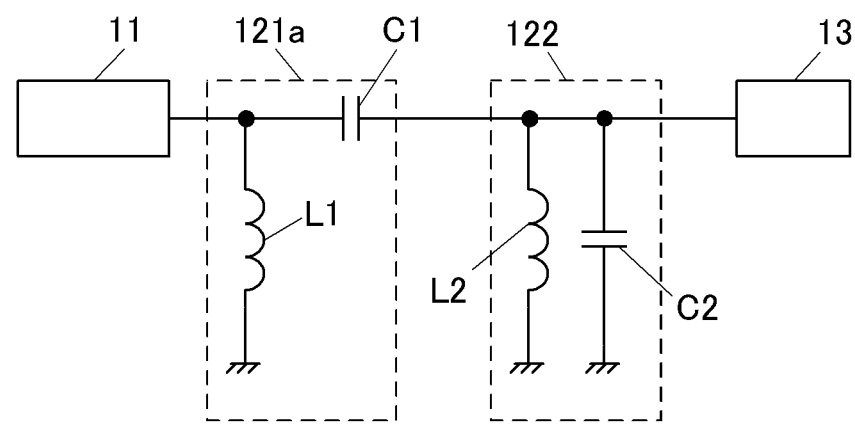
FIG. 4A shows another example of the adjustment circuit.

As shown in FIG. 4A, in a first adjustment circuit 121a, the first capacitor C1 is disposed in series, and the first inductor L1 is disposed in parallel.

Figure 4B:
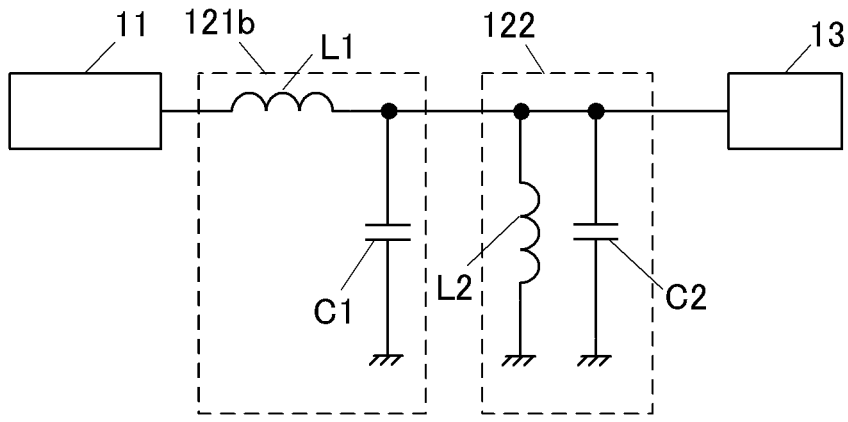
FIG. 4B shows another example of the adjustment circuit.

As shown in FIG. 4B, in a first adjustment circuit 121b, on the downstream side (side where the communication circuit 13 is provided) of the first inductor L1, the first capacitor C1 branches off from the signal path to be in parallel with the second adjustment circuit 122.

Figure 4C:
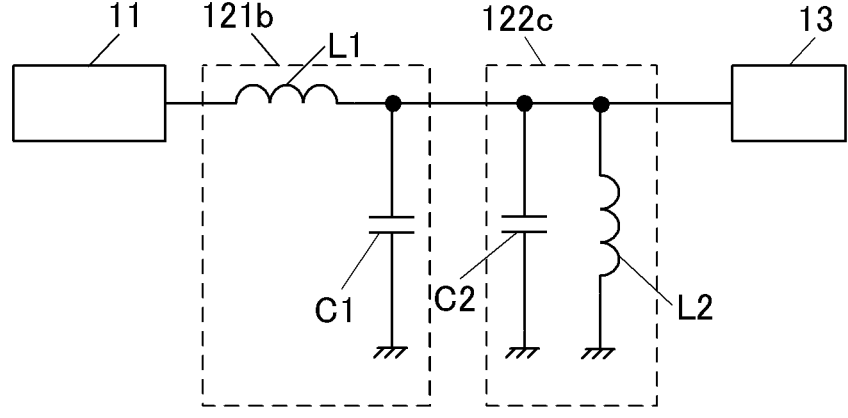
FIG. 4C shows another example of the adjustment circuit.

As shown in FIG. 4C, in a second adjustment circuit 122c, the second capacitor C2 and the second inductor L2 disposed in parallel are reserved in position (i.e., in arrangement) as compared with the second adjustment circuit 122. The second adjustment circuit 122c may be combined with any of the first adjustment circuits 121, 121a, 121b.

Figure 5A:
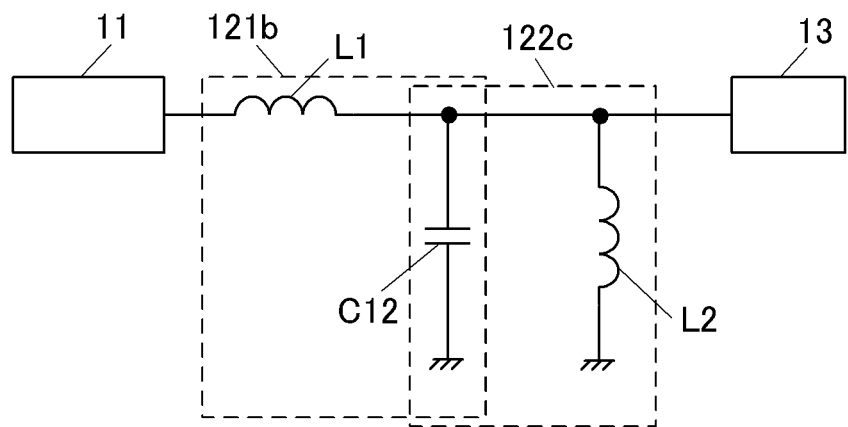
FIG. 5A shows another example of the adjustment circuit.

In FIG. 4C, between the first inductor L1 disposed in series and a branching point from the signal path to the second inductor L2 disposed in parallel, the first capacitor C1 and the second capacitor C2 are disposed next to one another in parallel. As shown in FIG. 5A, they may be integrated into a single capacitor C12. The capacitor C12 is used by both the first adjustment circuit 121b and the second adjustment circuit 122c. The electrical capacitance of the capacitor C12 is the sum of the electrical capacitance of the capacitor C1 and the electrical capacitance of the capacitor C2.

Figure 5B:
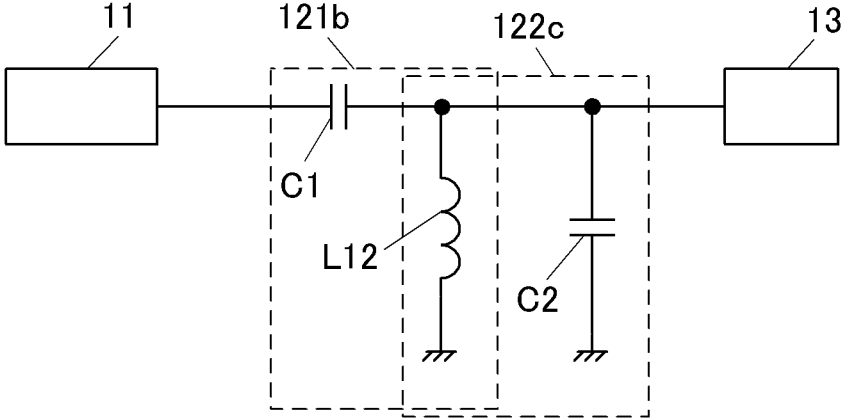
FIG. 5B shows another example of the adjustment circuit.

In the first adjustment circuit 121a shown in FIG. 4A, if a branching point from the signal path to the first inductor L1 and the first capacitor C1 are reversed in position, between the first capacitor C1 and a branch point from the signal path to the second capacitor C2, the first inductor L1 and the second inductor L2 are disposed next to one another in parallel. As shown in FIG. 5B, they may be integrated into a single inductor L12. The inductor L12 is used by both the first adjustment circuit 121b and the second adjustment circuit 122c. The inductance of the inductor L12 is the reciprocal of the sum of the reciprocal of the inductance of the first inductor L1 and the reciprocal of the inductance of the second inductor L2.

In some cases, the first adjustment circuit (e.g., 121a) is adjustable even if the two elements are both inductors or both capacitors. Hence, the first adjustment circuit (e.g., 121a) of the antenna device 1 is not limited to the combination of an inductor and a capacitor.

Once the above-described adjustment is made in the antenna device 1 or an electronic device or the like including the antenna device 1 and accordingly the parameters of the elements of the adjustment circuit 12 are specified, products can be assembled and manufactured in accordance with the specified parameters. Alternatively, products may be manufactured with the specified parameters such that the antenna device 1 or the electronic device or the like therein can be subjected to fine adjustment. That is, the antenna device 1 may be assembled and manufactured with the parameters of the elements changeable.

As described above, the adjustment method for the antenna device 1 of this embodiment including the annular antenna element 11, the adjustment circuit 12 including the first adjustment circuit 121 and the second adjustment circuit 122 connected in series with the antenna element 11, and the communication circuit 13 connected with the adjustment circuit 12, includes: determining circuit constants of the first adjustment circuit 121 such that at two frequencies f1, f2 as tuning targets, the values of the resistance R1 of the impedance Z1 as viewed from the output end of the first adjustment circuit 121 toward the antenna element 11 each are equal to the resistance Rf of the target impedance Zf, and the absolute values of the reactance X1 of the impedance Z1 are different from one another; and determining circuit constants of the second adjustment circuit 122 such that at the two frequencies f1, f2, while the values of the resistance R2 of the impedance Z2 as viewed from the output end of the adjustment circuit 12 toward the antenna element 11 are kept at the values of the resistance R1, the values of the reactance X2 of the impedance Z2 each are a complex conjugate with the reactance Xf of the target impedance Zf.

Usually, the parasitic capacitance and/or the like is present in a circuit (s) provided in an electronic device and exert an influence upon impedance matching. Due to this influence and/or the like, if a difference between frequencies is large, it is difficult to transmit or receive signals with a proper intensity in a wide band that covers both the frequencies.

According to this embodiment, in the first adjustment circuit 121, the values of the resistance R1 at the two frequencies f1, f2 are appropriately matched to the target resistance Rf. Since direct comparison between the resistance R1 and the target resistance Rf can be performed, the optimal parameters of the first adjustment circuit 121 can be found flexibly and easily. Further, the values of the reactance X1 thereat do not need to be matched at this stage and these are adjusted in the second adjustment circuit 122. Thus, the parameters to be adjusted can be assigned to the two circuits. Further, since the impedance pertaining to the intermediate frequency fc of the two frequencies, which is irrelevant to reception, is not taken into account, no time or effort is taken by unnecessary adjustment, and also no unnecessary restriction is present. According to the present disclosure, in an antenna device with a simple configuration, adjustment to transmit or receive radio waves of multiple frequencies more appropriately can be made.

Further, the second adjustment circuit 122 is a parallel resonant circuit. By appropriately adjusting and parallelly disposing two elements in the second adjustment circuit 122, the values of the reactance X (susceptance B) at the two frequencies are matched. Hence, even if the two frequencies are apart from one another and cannot be covered by tuning to the intermediate frequency fc, impedance matching can be appropriately performed about the two frequencies.

Further, the first adjustment circuit 121 includes a first circuit element connected in series with the antenna element 11 and the communication circuit 13, such as the first inductor L1, and a second circuit element connected in parallel with the communication circuit 13, such as the first capacitor C1. The L-shaped circuit composed of such a series element and such a parallel element in combination makes it possible to appropriately convert the values of the resistance R1 of the impedance Z1 at the two frequencies into the same value, regardless of the difference between the two frequencies.

Further, one of the first circuit element and the second circuit element may be the first inductor L1, and the other thereof may be the first capacitor C1. The combination of these makes it easy to make appropriate adjustment on the immittance chart in accordance with, for example, the difference (positional relationship) between the original impedance Za of the antenna element 11 and the target impedance Zf.

Further, the second circuit element may be used by both the first adjustment circuit 121 and the second adjustment circuit 122. If two elements of the same type are disposed in parallel, they may be integrated into a single element as shown in FIG. 5A and FIG. 5B. This can save a space for one element.

Further, the two frequencies f1, f2 may be radio-wave receiving frequencies different from one another. That is, the present disclosure may be used to adjust the antenna device 1 that is used as a multiband receiver circuit. There have been a larger number of cases where multiband reception is needed. The present disclosure contributes to efficient and appropriate impedance adjustment of a single antenna element.

Further, according to the present disclosure, the antenna device 1 includes the annular antenna element 11, the adjustment circuit 12 including the first adjustment circuit 121 and the second adjustment circuit 121 connected in series with the antenna element 11, and the communication circuit 13 connected with the adjustment circuit 12. The first adjustment circuit 121 converts the impedance Z1 such that at two frequencies f1, f2 as tuning targets, the values of the resistance R1 of the impedance Z1 as viewed from the output end of the first adjustment circuit 121 toward the antenna element 11 each are equal to the resistance Rf of the target impedance Zf, and the absolute values of the reactance X1 of the impedance Z1 are different from one another. The second adjustment circuit 122, at the two frequencies f1, f2, while keeping the values of the resistance R2 of the impedance Z2 as viewed from the output end of the adjustment circuit 12 toward the antenna element 11 at the values of the resistance R1, makes the values of the reactance X2 of the impedance Z2 each be a complex conjugate with the reactance Xf of the target impedance Zf and values of VSWR each be 2 or less, wherein if, in place of the second adjustment circuit 122, a parallel resonant circuit that resonates at the intermediate frequency fc between the two frequencies f1, f2 was inserted at the position of the second adjustment circuit 122, a value of the VSWR at the intermediate frequency fc would be more than 2.

The antenna device 1 can be obtained by directly and reliably matching the values of the impedance at the two frequencies f1, f2 as the turning targets, regardless of the intermediate frequency fc. The antenna device 1 can appropriately receive and/or transmit radio waves of two frequencies different from one another with a simple configuration.

The above embodiment is an example, and hence can be modified in a variety of respects.

For example, in accordance with the arrangement of the parallel element and the series element in the first adjustment circuit 121, which one is adjusted first may be determined as appropriate.

Further, in the above embodiment, between the antenna element 11 and the communication circuit 13, only the adjustment circuit 12 is provided, but this is not a limitation. Between the antenna element 11 and the communication circuit 13, a filter, an amplifier and so forth may also be provided. In this case, the electrical capacitance and/or the inductance associated with these elements exert an influence on impedance matching. Hence, as a circuit including these, the adjustment for impedance matching is made.

Further, in the above embodiment, radio waves of two frequencies are received. Instead, radio waves of two frequencies may be transmitted, or two frequencies may be combination of a transmitting frequency and a receiving frequency different from one another.

Further, the number of elements in the adjustment circuit 12 is not limited to that described in the above embodiment. For example, the first capacitor C1 and the second capacitor C2 each may be divided into multiple capacitors.

Further, in the above embodiment, the adjustment is made by checking the immittance chart, but may be made by using Smith chart (impedance chart) only. The adjustment can be made even without using any chart.

The details of the components, the the configuration, the contents and procedure of adjustment and so forth described in the above embodiment can be appropriately changed without departing from the scope of the present disclosure. The scope of the present disclosure includes the scope of claims below and the scope of their equivalents.

The invention claimed is:

1. An antenna device comprising:
an annular antenna;
an adjustment circuit including a first circuit and a second circuit connected in series with the antenna; and
a wireless communication circuit connected with the adjustment circuit, wherein the first circuit converts a first impedance such that at two frequencies as tuning targets, values of a first resistance of the first impedance as viewed from an output end of the first circuit toward the antenna each are equal to resistance of a target impedance, and absolute values of a first reactance of the first impedance are different from one another, and wherein the second circuit, at the two frequencies, while keeping values of a second resistance of a second impedance as viewed from an output end of the adjustment circuit toward the antenna at the values of the first resistance, makes values of second reactance of the second impedance each be a complex conjugate with a reactance of the target impedance and values of VSWR each be 2 or less, wherein if a parallel resonant circuit that resonates at an intermediate frequency between the two frequencies was inserted at a position of the second circuit, a value of the VSWR at the intermediate frequency would be more than 2.

2. The antenna device according to claim 1, wherein the second circuit is a parallel resonant circuit.

3. The antenna device according to claim 2, wherein the first circuit includes:

a first circuit element connected in series with the antenna and the wireless communication circuit; and a second circuit element connected in parallel with the wireless communication circuit.

4. The antenna device according to claim 3, wherein one of the first circuit element and the second circuit element is an inductor, and the other thereof is a capacitor.

5. The antenna device according to claim 3, wherein the second circuit element is used by both the first circuit and the second circuit.

6. The antenna device according to claim 1, wherein the two frequencies are radio-wave receiving frequencies different from one another.

7. An adjustment method for an antenna device including an annular antenna, an adjustment circuit including a first circuit and a second circuit connected in series with the antenna, and a wireless communication circuit connected with the adjustment circuit, comprising:

determining circuit constants of the first circuit such that at two frequencies as tuning targets, values of a first resistance of a first impedance as viewed from an output end of the first circuit toward the antenna each are equal to resistance of a target impedance, and absolute values of a first reactance of the first impedance are different from one another; and determining circuit constants of the second circuit such that at the two frequencies, while values of a second resistance of a second impedance as viewed from an output end of the adjustment circuit toward the antenna are kept at the values of the first resistance, values of a second reactance of the second impedance each are a complex conjugate with a reactance of the target impedance.

8. The adjustment method according to claim 7, wherein the second circuit is a parallel resonant circuit.

9. The adjustment method according to claim 8, wherein the first circuit includes:

a first circuit element connected in series with the antenna and the wireless communication circuit; and a second circuit element connected in parallel with the wireless communication circuit.

10. The adjustment method according to claim 9, wherein one of the first circuit element and the second circuit element is an inductor, and the other thereof is a capacitor.

11. The adjustment method according to claim 9, wherein the second circuit element is used by both the first circuit and the second circuit.

12. The adjustment method according to claim 7, wherein the two frequencies are radio-wave receiving frequencies different from one another.

* * * * *